United States Patent
Yamada

(10) Patent No.: US 7,620,083 B2
(45) Date of Patent: Nov. 17, 2009

(54) SEMICONDUCTOR LASER DRIVE SYSTEM AND SEMICONDUCTOR LASER DRIVING METHOD

(75) Inventor: Minoru Yamada, Kanazawa (JP)

(73) Assignee: National University Corporation Kanazawa University, Kanazawa (JP)

( * ) Notice: Subject to any disclaimer, the term of this patent is extended or adjusted under 35 U.S.C. 154(b) by 80 days.

(21) Appl. No.: 11/991,000

(22) PCT Filed: Aug. 31, 2006

(86) PCT No.: PCT/JP2006/317228

§ 371 (c)(1),
(2), (4) Date: Feb. 26, 2008

(87) PCT Pub. No.: WO2007/026826

PCT Pub. Date: Mar. 8, 2007

(65) Prior Publication Data

US 2009/0147809 A1    Jun. 11, 2009

(30) Foreign Application Priority Data

Sep. 2, 2005   (JP) .............................. 2005-255109
Mar. 8, 2006   (JP) .............................. 2006-063168

(51) Int. Cl.
   *H01S 3/13*   (2006.01)
   *H01S 3/00*   (2006.01)

(52) U.S. Cl. ............................... 372/29.011; 372/38.01

(58) Field of Classification Search .............. 372/29.01, 372/29.011, 38.01, 38.02, 38.08, 50.21
See application file for complete search history.

(56) References Cited

FOREIGN PATENT DOCUMENTS

JP    A 5-129706    5/1993
JP    A 2000-77774   3/2000

OTHER PUBLICATIONS

A. Ariomoto, et al; "Optimum conditions for the high frequency noise reduction method in optical videodisc players," *Applied Optics.*, vol. 25, No. 9; pp. 1398-1403; May 1986.
M. Yamada; "Theoretical analysis of noise-reduction effect in semiconductor lasers with help of self-sustained pulsation phenomena," *J. Appl. Phys*; vol. 79, No. 1; pp. 61-71, Jan. 1996.
M. Yamada et al; "Characteristics of Mode-Hopping Noise and Its Suppression with the Help of Electric Negative Feedback in Semiconductor Lasers;" *IEEE Journal of Quantum Electronics*, QE-23, No. 8, pp. 1297-1302, Aug. 1987.

*Primary Examiner*—Armando Rodriguez
(74) *Attorney, Agent, or Firm*—Oliff & Berridge, PLC

(57) ABSTRACT

A semiconductor laser drive system and a semiconductor laser driving method where both internal noise and optical feedback noise can be simultaneously reduced are provided at low cost and low power consumption. The semiconductor laser drive system in an optical pickup configured such that a turn light 9e from an irradiated object of a laser beam 9 emitted from a semiconductor laser 2 enters into the semiconductor laser 2 is composed of a drive circuit 3 for driving the semiconductor laser 2; an optical detector 6 for detecting light intensity of a laser beam 9b where the laser beam 9 emitted from the semiconductor laser 2 is ramified to convert the light intensity into an electric signal; and a feedback circuit that is composed of an amplifier circuit 7 and a filter circuit arranged between the drive circuit 3 and the light detector 6, and that applies electric negative feedback to the drive circuit 3 for reducing optical feedback noise if the frequency of the electric signal is within a frequency banc to be utilized as a signal, and that applies electric positive feedback to the drive circuit 3 for reducing internal noise if the frequency of the electric signal is outside the frequency band to be utilized as a signal.

10 Claims, 10 Drawing Sheets

(a) No return light (b) Return light exist (return light ratio : 0.0048)

(a) Return light exist (Return light ratio $\Gamma=0.015$)

(b) Return light exist (Return light ratio $\Gamma=0.07$)

SEMICONDUCTOR LASER DRIVE SYSTEM AND SEMICONDUCTOR LASER DRIVING METHOD

TECHNICAL FIELD

The present invention relates to a semiconductor laser drive system and a semiconductor laser driving method, in an optical device having an optical system that is configured such that return light from an irradiated object of a laser beam emitted from a semiconductor laser enters into the semiconductor laser.

RELATED ART

A semiconductor laser is utilized as the light source of an optical device, such as an optical disc device or an optical fiber communication device. However, when laser beam emitted from the semiconductor laser is reflected by an irradiated object, such as an optical disc or an optical fiber facet, and the return light is re-entered into the semiconductor laser, excess noise referred to as optical feedback noise is generated.

As a measure against such optical feedback noise, in a "near-infrared semiconductor laser", a semiconductor laser that has already been widely in practical use, a high-frequency superposition method where the optical feedback noise is reduced by superposing a high-frequency electric current at several hundred MHz to several GHz onto a driving current in the drive circuit of the semiconductor laser (reference Non-patent document 1, A. Ariomoto, M. Ojima, N. Chinone, A. Oishi, T. Gotoh and N. Ohnuki: "Optimum conditions for the high frequency noise reduction method in optical videodisc players", Appl. Opt., vol. 25, no. 9, pp. 1398-1403, 1986) and another method for reducing the optical feedback noise using the self-sustained pulsation phenomena of a self-sustained pulsation laser (reference Non-patent document 2, M. Yamada: "Theoretical analysis of noise reduction effect in semiconductor lasers with help of self-sustained pulsation phenomena", J. Appl. Phys., vol. 79, no. 1, pp. 61-71, 1996) have been established.

However, in a "blue-violet semiconductor laser" where high-density data recording is expected, although it is obviously necessary for reducing the optical feedback noise, since the noise level of quantum noise, an intrinsic noise of the semiconductor laser, becomes higher than that of a near-infrared semiconductor laser, it is important for reducing the internal noise of the semiconductor laser until it becomes sufficiently lower than the quantum noise level.

As a method for reducing the internal noise of the semiconductor laser, a method by applying electric negative feedback according to light intensity of a laser beam emitted from the semiconductor laser to the drive circuit of the semiconductor laser (reference Non-patent document 3, M. Yamada, N. Nakaya and M. Funaki: "Characteristics of Mode-Hopping Noise and Its Suppression with the Help of Electric Negative Feedback in Semiconductor Lasers", IEEE JOURNAL OF QUANTUM ELECTRONICS, QE-23, No. 8, pp. 1297-1302, AUGUST 1987) has already been proposed by the inventors of the present application. When this method is applied to an injection type semiconductor laser, such as the near-infrared semiconductor laser, a predetermined internal nose reduction effect can be obtained.

[Non patent document 1] A. Ariomoto, M. Ojima, N. Chinone, A. Oishi, T. Gotoh and N. Ohnuki: "Optimum conditions for the high frequency noise reduction method in optical videodisc players", Appl. Opt., vol. 25, no. 9, pp. 1398-1403, 1986

[Non patent document 2] M. Yamada: "Theoretical analysis of noise reduction effect in semiconductor lasers with help of self-sustained pulsation phenomena", J. Appl. Phys., vol. 79, no. 1, pp. 61-71, 1996

[Non patent document 3] M. Yamada, N. Nakaya and M. Funaki: "Characteristics of Mode-Hopping Noise and Its Suppression with the Help of Electric Negative Feedback in Semiconductor Lasers", IEEE JOURNAL OF QUANTUM ELECTRONICS, QE-23, No. 8, pp. 1297-1302, AUGUST 1987

DISCLOSURE OF THE INVENTION

Problems to be Solved by the Invention

When the method for reducing the internal noise by applying the electric negative feedback to the drive circuit of the semiconductor laser is applied to a near-infrared semiconductor laser, the predetermined internal noise reduction effect can be obtained. However, in applying this method to a blue-violet semiconductor laser, it is essential to simultaneously use this method along with the method for reducing the optical feedback noise. However, for example, when the drive circuit of the semiconductor laser is configured to simultaneously use "Internal noise reduction method due to electric negative feedback" and "High-frequency superimposition method or optical feedback noise reduction method using the self-sustained pulsation phenomena", the drive circuit of the semiconductor laser becomes complicated, increasing the cost.

The first objective of the present invention is to provide a semiconductor laser drive system that can simultaneously reduce both the internal noise and the optical feedback noise at low cost and low power consumption.

The second objective of the present invention is to provide a semiconductor laser driving method where both the internal noise and the optical feedback noise are simultaneously reduced at low cost and low power consumption.

Means for Solving the Problem

In order to accomplish the first objective, a first aspect of the present invention described in claim 1 is a semiconductor laser drive system in an optical device having an optical system configured such that a return light from an irradiated object of a laser beam emitted from a semiconductor laser enters into the semiconductor laser, comprising: a drive circuit for driving the semiconductor laser; an optical detector for detecting the light intensity of the laser beam emitted from the semiconductor laser and converting the light intensity into an electric signal; and an electric feedback circuit arranged between the drive circuit and the optical detector for selectively applying electric negative feedback or electric positive feedback to the drive circuit according to whether or not the frequency of the electric signal is within a frequency band to be utilized as a signal.

A second aspect of the present invention described in claim 2 is characterized by the fact that the electric feedback circuit is composed of an amplifier circuit and a filter circuit, and an amplification factor of the amplifier circuit and a phase characteristic of the filter circuit are set to apply electric negative feedback to the drive circuit of the semiconductor laser if the frequency of the electric signal is within the frequency band to be utilized as a signal, and the amplification factor and the phase characteristic are set to apply electric positive feedback to the drive circuit of the semiconductor laser if the frequency of the electric signal is outside the frequency band to be utilized as a signal.

A third aspect of the present invention described in claim 3 is characterized by the fact that the semiconductor laser is a blue-violet semiconductor laser.

In order to accomplish the second objective, a fourth aspect of the present invention described in claim 4 is a semiconductor laser driving method in an optical device having an optical system that is configured such that a return light from an irradiated object of a laser beam emitted from a semiconductor laser enters into the semiconductor laser, comprising the steps of: detecting light intensity of the laser beam emitted from the semiconductor laser in order to convert into an electric signal; and selectively applying electric negative feedback or electric positive feedback to the drive circuit of the semiconductor laser according to whether or not the frequency of the electric signal is within the frequency band to be utilized as a signal.

A fifth aspect of the present invention described in claim 5 is characterized by the fact that the electric negative feedback is applied to the drive circuit of the semiconductor laser if the frequency of the electric signal is within the frequency band to be utilized as a signal, and the electric positive feedback is applied to the drive circuit of the semiconductor laser if the frequency of the electric signal is outside the frequency band to be utilized as a signal.

The sixth invention described in claim 6 is characterized by the fact that the semiconductor laser is a blue-violet semiconductor laser.

EFFECT OF THE INVENTION

According to the first aspect of the present invention, since the semiconductor laser drive system in an optical device having an optical system that is configured such that return light from an irradiated object of a laser beam emitted from the semiconductor laser enters into the semiconductor laser is composed of a drive circuit that drives the semiconductor laser; an optical detector that detects the light intensity of the laser beam emitted from the semiconductor laser and converts the light intensity into an electric signal; and an electric feedback circuit that is arranged between the drive circuit and the optical detector, and that selectively applies electric negative feedback or electric positive feedback to the drive circuit according to whether or not frequency of the electric signal is within a frequency band to be utilized as a signal. For example, the internal noise is reduced by configuring the electric feedback circuit to apply electric negative feedback to the drive circuit if the frequency of the electric signal is within the frequency band to be utilized as a signal. Moreover, the optical feedback noise can be reduced by configuring the feedback circuit to apply electric positive feedback to the drive circuit if the frequency of the electric signal is outside the frequency band to be utilized as a signal. Therefore, a semiconductor laser drive system that can simultaneously reduce both the internal noise and the return noises can be provided at low cost and low power consumption.

According to the second aspect of the present invention, since the electric feedback circuit is composed of an amplifier circuit and filter circuit and the amplification factor of the amplifier circuit and the phase characteristic of the filter circuit are set to apply the electric negative feedback to the drive circuit of the semiconductor laser if the frequency of the electric signal is within the frequency band to be utilized as a signal, and to apply the electric positive feedback to the drive circuit of the semiconductor laser if the frequency of the electric signal is outside the frequency band to be utilized as a signal, both the internal noise and the optical feedback noise can be simultaneously reduced as desired.

According to the third aspect of the present invention, since the semiconductor laser is a blue-violet semiconductor laser, the quantum noise level of the blue-violet semiconductor laser is higher than that of the near-infrared semiconductor laser, and an internal noise reduction effect is especially required; preferable for a semiconductor laser where the drive system of the present invention is applied.

According to the fourth aspect of the present invention, when driving a semiconductor laser in an optical device having an optical system configured such that return light from an irradiated object of a laser beam emitted from a semiconductor laser enters into the semiconductor laser; the light intensity of the laser beam emitted from a semiconductor laser is detected and converted into an electric signal, and the electric negative feedback or the electric positive feedback is selectively applied to the drive circuit of the semiconductor laser according to whether or not the frequency of the electric signal is within the frequency band to be utilized as a signal. Therefore, for example, if the frequency of the electric signal is within the frequency band to be utilized as a signal, the internal noise is reduced by applying the electric negative feedback to the drive circuit. Moreover, if the frequency of the electric signal is outside the frequency band to be utilized as a signal, the optical feedback noise can be reduced by applying the electric positive feedback to the drive circuit. Therefore, a semiconductor laser driving method where both the internal noise and the optical feedback noise can be simultaneously reduced can be provided at low cost and low power consumption.

According to the fifth aspect of the present invention, since the electric negative feedback is applied to the drive circuit of the semiconductor laser if the frequency of the electric signal is within the frequency band to be utilized as a signal, and the electric positive feedback is applied to the drive circuit of the semiconductor laser if the frequency of the electric signal is outside the frequency band to be used as a signal. Therefore, and both the internal noise and the optical feedback noise can be simultaneously reduced as desired.

According to the sixth aspect of the present invention, since the semiconductor laser is a blue-violet semiconductor laser, the quantum noise level of the blue-violet semiconductor laser becomes higher than that of the near-infrared semiconductor laser, in which the internal noise reduction effect is especially required. Therefore, the driving method according to the sixth aspect of the present invention is preferably applied to a semiconductor laser.

DESCRIPTION OF THE NUMERALS

Figure 1:
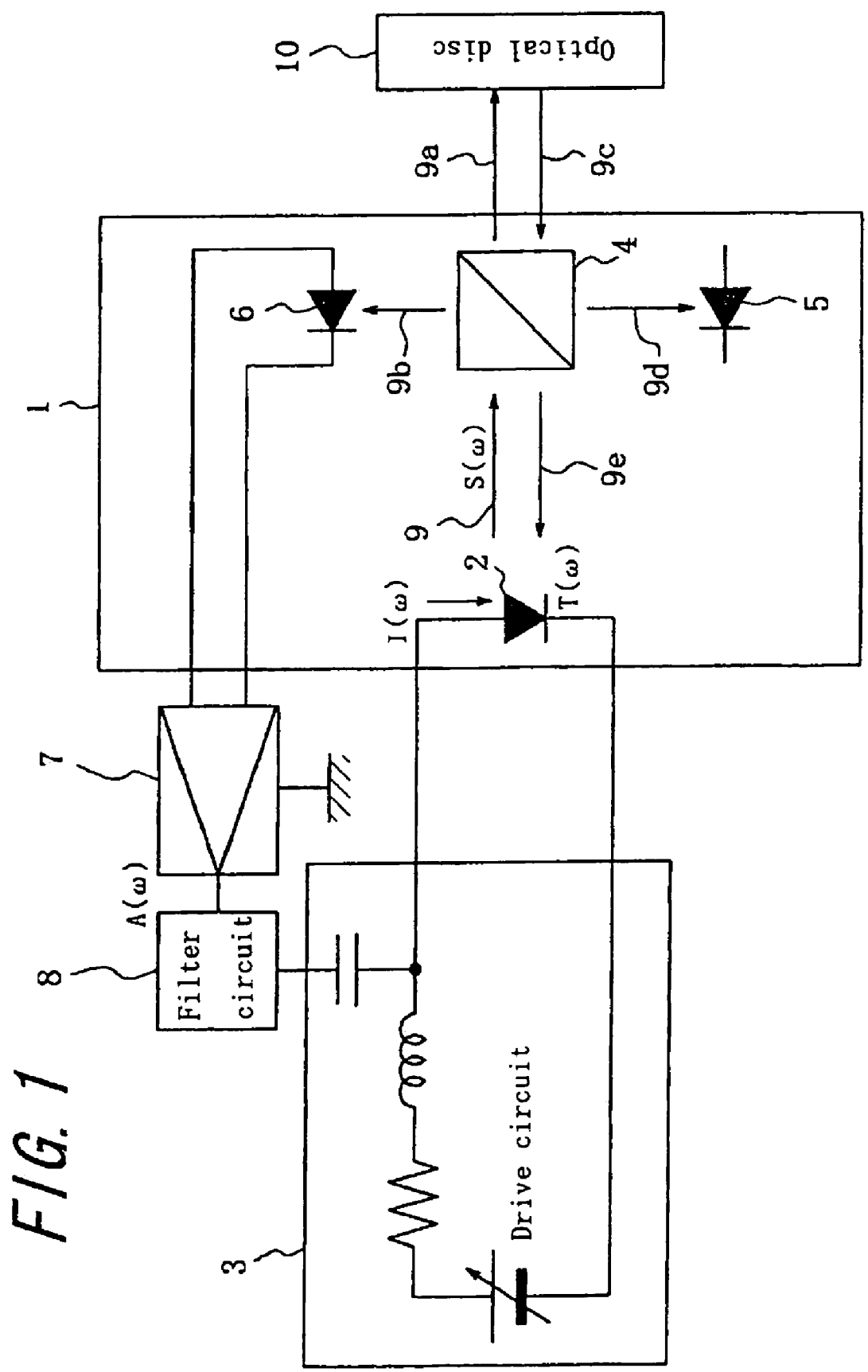
FIG. 1 is a diagram showing a principle configuration of the semiconductor laser drive system in the first embodiment.

1 Optical pickup
2 Semiconductor laser
3 Drive circuit
4 Beam splitter
5 Optical detector for signal reproduction
6 Optical detector for laser beam detection
7 Amplifier circuit
8 Filter circuit
9, 9a, 9b Laser beam
9c, 9d, 9e Return light
10 Optical disc

BEST MODE FOR CARRYING OUT THE INVENTION

The best mode for implementing the present invention is described in detail hereafter, based upon the drawings.

FIG. 1 is a diagram illustrating the principle configuration of the semiconductor laser drive system in the first embodiment of the present invention. FIG. 1 shows an example where the semiconductor laser drive system of the present invention is applied to an optical pickup of the optical disc device, and the symbol '1' represents the optical pickup.

The semiconductor laser drive system is composed with the optical pickup 1, a drive circuit 3, an amplifier circuit 7 and a filter circuit 8, and the optical pickup 1 is composed of a semiconductor laser 2, a beam splitter 4, an optical detector 5 for signal reproduction and an optical detector 6 for laser beam detection.

As the semiconductor laser 2, various semiconductor lasers, such as a near-infrared semiconductor laser or a blue-violet semiconductor laser, can be used, and in particular, the blue-violet semiconductor laser is preferable because when this is used as the semiconductor laser 2, the internal noise reduction effect, which is a target of the present invention, becomes significant.

The drive circuit 3 is for driving the semiconductor laser 2, and for example, it is composed of a series circuit, which is connected to the anode and cathode of the semiconductor laser 2 and is composed of a coil, a resistor and a variable voltage source, and a condenser connected between a connection point of the anode of the semiconductor 2 & the coil and the filter circuit 8.

The beam splitter 4 ramifies an incident laser beam 9 into the direction of transmission and a reflection direction at a predetermined ratio (for example, 50:50) and the ramified laser beams are regarded as a laser beam 9a and a laser beam 9b, respectively.

When the laser beam 9 emitted from the semiconductor laser 2 is transmitted through the beam splitter 4 and is irradiated toward the optical disc 10, a return light 9c from the optical disc 9 is reflected by the beam splitter 4 and a light 9d enters into the optical detector 5 for signal reproduction and the optical detector 5 detects the light 9d as an electric signal, and an output signal of the optical detector 5 is used for reproduction of signals recorded in the optical disc 9.

When the laser beam 9 emitted from the semiconductor laser 2 is ramified into the reflection direction by the beam splitter 4 and the laser beam 9b enters into the optical detector 6 for laser beam detection, the optical detector 6 detects the light intensity of the laser beam 9b and converts the light intensity into an electric signal.

The amplifier circuit 7 and the filter circuit 8 are arranged between the optical detector 6 and the drive circuit 3, and they comprise the electric feedback circuit that selectively applies electric negative feedback (hereafter, simply referred to as negative feedback) or electric positive feedback (hereafter, simply referred to as positive feedback) to the drive circuit 3 according to whether or not the frequency of the electric signal is within the frequency band to be utilized as a signal, and when high-frequency current, for example, at approximately several hundred MHz is superposed to the drive current of the semiconductor laser 2, the optical feedback noise is reduced. At the same time, by superposition of rather low frequency, for example, lower than 100 MHz on the drive current of the semiconductor laser 2, the internal noise is reduced to be lower than the quantum noise level. The amplification factor of the amplifier circuit 7 and the phase characteristic of the filter circuit 8 are set to apply the negative feedback to the drive circuit 3 of the semiconductor laser 2 if the frequency of the electric signal is within the frequency band to be utilized as a signal, and applies positive feedback to the drive circuit 3 of the semiconductor laser 2 if the frequency of the electric signal is outside the frequency band to be utilized as a signal. Moreover, the frequency characteristic of the amplification factor and the phase change of the feedback circuit composed of the amplifier circuit 7 and the filter circuit 8 may be optionally designed to utilize the characteristics suitable for the reduction of the internal noise and the optical feedback noise. Furthermore, the example shown in FIG. 1 is configured such that the amplifier circuit 7 is arranged at the side of the optical detector 6, and that the filter circuit 8 is arranged at the side of the drive circuit 3. However, the configuration may be modified to arrange the filter circuit 8 at the side of the optical detector 6, and to arrange the amplifier circuit 7 at the side of the drive circuit 3.

In the above-mentioned configuration, the semiconductor laser drive system of the present invention is applied to an optical pickup. However, the semiconductor laser drive system of the present invention may also be applied to any optical device, as long as the optical device has an optical system configured such that the return light (the return light $9c$ when the example in FIG. 1) from an irradiated object (such as an optical disc) of the laser beam emitted from a semiconductor laser, such as a light source for optical fiber communication or various optical measuring device light sources, enters into the semiconductor laser.

The operation of the semiconductor laser drive system of the present invention will be described hereinafter.

In FIG. 1, the laser beam 9 emitted from the semiconductor laser 2 is ramified into two laser lights $9a$ and $9b$ by the beam splitter 4, and the laser beam $9a$ transmitted through the beam splitter 4 is reflected by the optical disc 10 and the reflected laser beam is regarded as a return light $9c$. Approximately one-half of light of this return light $9c$ is reflected by the beam splitter 4 and enters into the optical detector 5, and it is detected as an electric signal for signal reproduction. However, a light $9e$, which is another half of the return light $9c$ from the optical disc 10, is transmitted through the beam splitter 4 and returned to and re-entered into the semiconductor laser 2. Associated with this re-entering, the semiconductor laser 2 generates excess noise referred to as "optical feedback noise".

The semiconductor laser drive system of the present invention is designed such that the laser beam $9b$, which is one of the laser beams where the laser beam 9 emitted from the laser 2 is ramified into two lights by the beam splitter 4, enters into the optical detector 6 and converted into an electric signal, and after the electric signal is amplified by the amplifier circuit 7 and the amplitude and phase characteristics are adjusted by the filter circuit 8, the electric signal is returned to the drive circuit 3 of the semiconductor laser 2.

The greatest feature of the semiconductor laser drive system of the present invention is to design the amplification factor of the amplifier circuit 7 and the phase characteristic of the filter circuit 8 to enable the coexistence of both a frequency band where the negative feedback is applied and another frequency where the positive feedback is applied, when applying the electric feedback to the drive circuit 3 of the semiconductor laser 2 by the feedback circuit composed of the amplifier circuit 7 and the filter circuit 8. In other words, "the feedback circuit selectively applying the negative feedback or the positive feedback to the drive circuit 3 of the semiconductor laser 2" can be realized by applying the negative feedback within the angular frequency band of "$0 \leq \omega \leq \omega_1$" which is utilized as a signal in the optical pickup, and by applying the positive feedback at the angular frequency of "$\omega = \omega_0$" which is higher than the signal band of "$0 \leq \omega \leq \omega_1$"

The operating principle of the semiconductor laser drive system of the present invention will be described hereafter using mathematical equations.

In FIG. 1, when an alternating current flowing into the semiconductor laser 2 is put as $I(\omega)$, a transfer function to the output light of the semiconductor laser 2 from this alternating current is put as $T(\omega)$ and quantum noise of the semiconductor laser 2 is put as $X(\omega)$, the internal noise $S(\omega)$, which is a fluctuation component (alternating current component) of the output light from the semiconductor laser 2, can be expressed with the following equation:

$$S(\omega) = I(\omega) \times T(\omega) + X(\omega) \qquad (1)$$

Since generation of rather large internal noise $S(\omega)$ in this semiconductor laser 2 is the problem, the object of the present invention is to reduce the internal noise $S(\omega)$ to be sufficiently lower than the quantum noise level of $X(\omega)$.

In the meantime, when the noise generated in the optical detector 6 and the input stage of the amplifier circuit 7 is put as $N(\omega)$ and a synthetic transmission function including the amplifier circuit 7 and the filter circuit 8 is put as $A(\omega)$, the electric current $I(\omega)$ to feedback to the semiconductor laser 2 becomes as:

$$I(\omega) = \{S(\omega) + N(\omega)\} \times A(\omega) \qquad (2)$$

By combining equations (1) and (2), the internal noise $S(\omega)$ of the semiconductor laser 2 is given as:

$$S(\omega) = \{N(\omega) \times A(\omega) \times T(\omega) + X(\omega)\} / \{(1 - A(\omega) \times T(\omega)\} \qquad (3)$$

At this time, when the angular frequency band to be utilized as a signal in the optical pickup is "$0 \leq \omega \leq \omega_1$", the feedback circuit composed of the amplifier circuit 7 and the filter circuit 8 is designed to apply the positive feedback at the angular frequency of "$\omega \approx \omega_0 \leq \omega_1$" which is higher than the signal band of "$0 \leq \omega \leq \omega_1$":

$$A(\omega_0) \times T(\omega_0) \approx |A(\omega_0) \times T(\omega_0)| \leq 1$$

Figure 2:
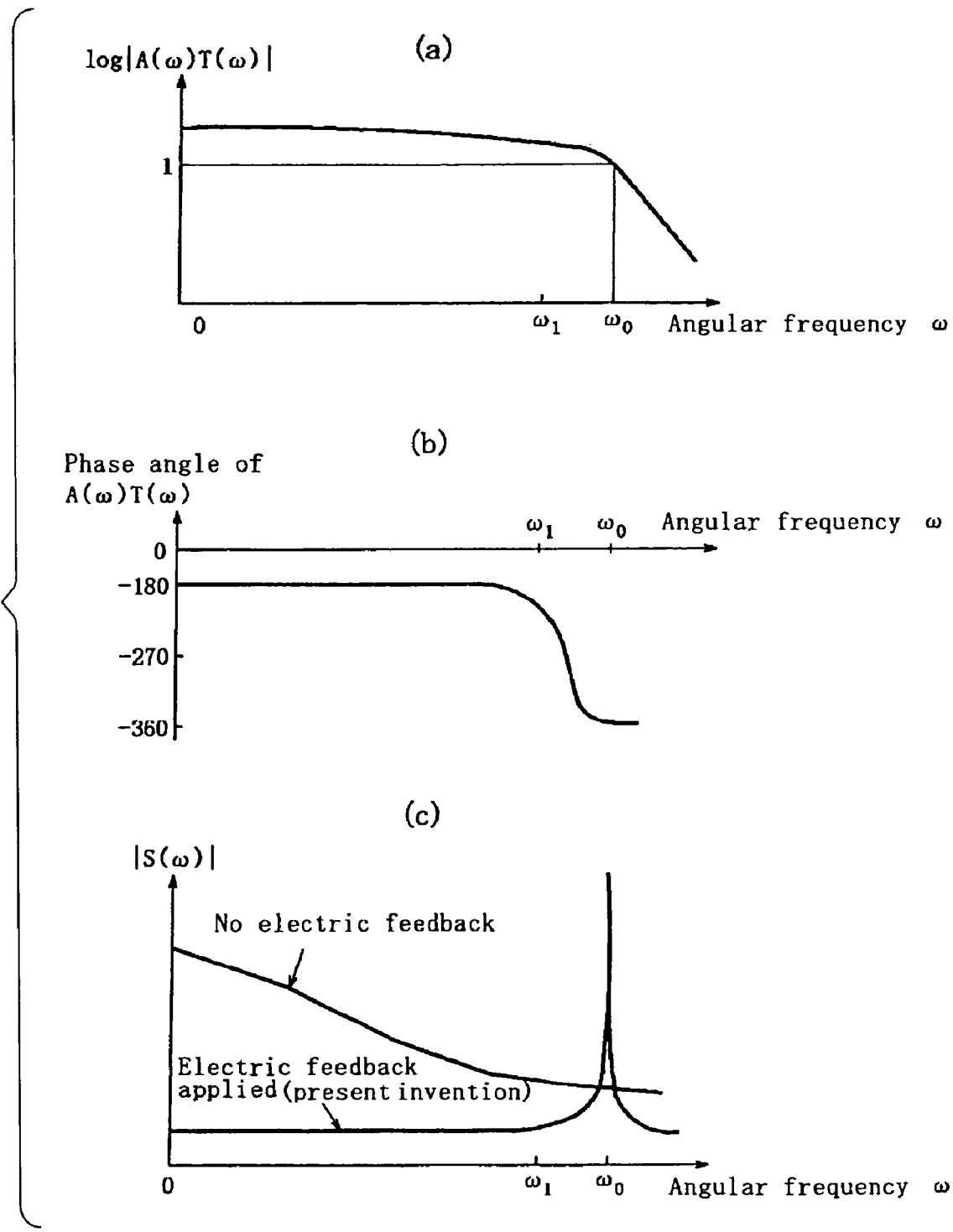
FIGS. 2(a) and (b) are characteristic diagrams for illustrating the frequency characteristics to be used when designing the electric feedback circuit in the semiconductor laser drive system in the first embodiment.
FIG. 2(c) is a characteristic diagram for describing the noise reduction effect of the semiconductor laser drive system in the first embodiment.

Specifically, the amplification factor of the amplifier circuit 7 and the phase angle of the filter circuit 8 are designed to follow the frequency characteristic of "$\log |A(\omega) \times T(\omega)|$" shown in FIG. 2(a) and to follow the frequency characteristic of the phase angle of "$A(\omega) \times T(\omega)$" shown in FIG. 2(b). Since the present invention apply the electric positive feedback around at $\omega = \omega_0$, the number of photons and the electronic density increase around this angular frequency. Namely, "$|S(\omega_0)|$", which is an absolute value of the alternating component "$S(\omega)$" of the output light from the semiconductor laser 2, increases rapidly as shown in FIG. 2(c). Due to the rapid increase of $|S(\omega_0)|$, the optical feedback noise in "$0 \leq \omega \leq \omega_1$", which is the angular frequency band to be utilized as a signal in the optical pickup, is reduced similarly as "the method for reducing optical feedback noise using a self-sustained pulsation phenomena of the self-sustained pulsation laser" described in Non-patent Literature 2, basing on nonlinear optical phenomena occurred in the semiconductor laser 2. Therefore, the optical feedback noise can be reduced down to the quantum noise level.

In the meantime, the range "$0 \leq \omega \leq \omega_1$", which is the angular frequency band to be utilized as a signal in the optical pickup, the feedback circuit composed of the amplifier circuit 7 and the filter circuit 8 is designed to apply the following negative feedback:

$$A(\omega) \times T(\omega) < 0 \text{ and } |A(\omega) \times T(\omega)| \gg 1$$

Specifically, the amplification factor of the amplifier circuit 7 and the phase angle of the filter circuit 8 are designed to have the frequency characteristic of "$\log |A(\omega) \times T(\omega)|$" shown in FIG. 2(a) and the frequency characteristic of the phase angle of "$A(\omega) \times T(\omega)$" shown in FIG. 2(b). Associated with this, the internal noise $S(\omega)$ of the semiconductor laser 2 becomes as follow, according to the equation (3):

$$S(\omega) = -N(\omega) \qquad (4)$$

In general, the noise $N(\omega)$ generated in the optical detector 6 and the input stage of the amplifier circuit 7 is sufficiently smaller than the quantum noise $X(\omega)$ of the semiconductor laser. Therefore, the internal noise $S(\omega)$ of the semiconductor laser 2 is sufficiently smaller than the quantum noise $X(\omega)$ of the semiconductor laser.

According to the semiconductor laser drive system of the present invention, the internal noise can be reduced by applying the negative feedback in range of "$0 \leq \omega \leq \omega_1$", which is the angular frequency band to be utilized as a signal in the optical pickup. At the same time, the optical feedback noise can be reduced by applying the positive feedback with "$\omega = \omega_0$", which is higher frequency than the above-mentioned band. Therefore, according to the present invention, the semiconductor laser drive system that can operate the blue-violet semiconductor laser where the internal noise is high because of high quantum noise level and the optical feedback noise is tend to be easily generated can be realized at low cost and low power consumption, as well as the near-infrared semiconductor laser.

Embodiment

An embodiment of the semiconductor laser drive system of the present invention is described hereafter.

[Measurement of Noise Reduction Effect (1)]

Figure 3:
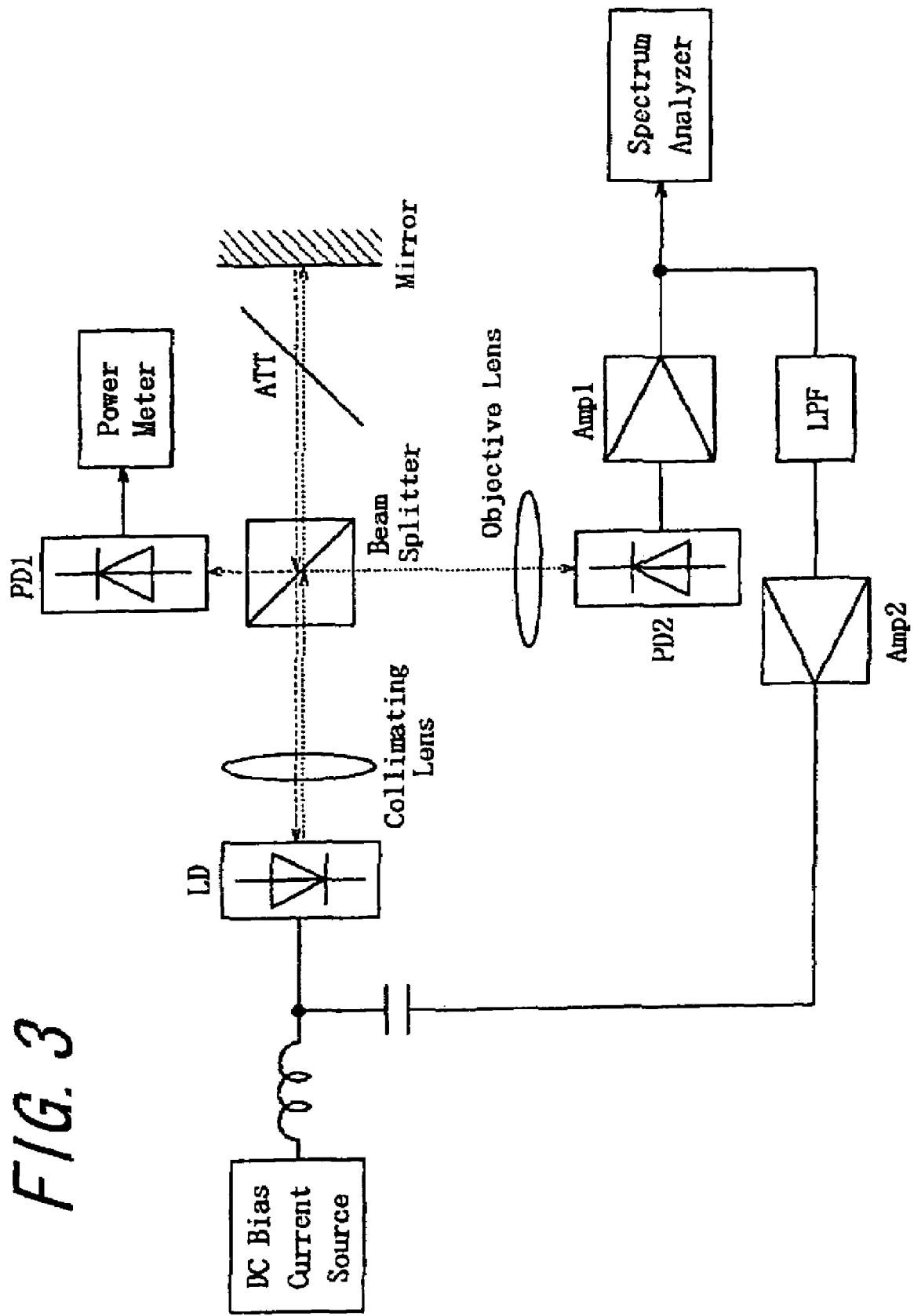
FIG. 3 is a diagram illustrating the configuration of a measuring device for confirming the noise reduction effect in the semiconductor laser drive system of the present invention.

In order to confirm the reduction effect of the internal noise due to the negative feedback in "$0 \leq \omega \leq \omega_1$" to be utilized as a signal in the optical pickup and the reduction effect of the optical feedback noise due to the positive feedback in the angular frequency at "$\omega \approx \omega_0$", which is higher than "$0 \leq \omega \leq \omega_1$" in the semiconductor laser drive system of the present invention, a measuring device shown in FIG. 3 was prepared.

In FIG. 3, LD is a blue-violet semiconductor laser (lasing wavelength: 410 nm, lasing threshold current: 42.5 mA) corresponding to the semiconductor laser 2 shown in FIG. 1; a Collimating lens is a focusing lens that is not shown in FIG. 1; an Objective lens is an objective lens that is not shown in FIG. 1; PD1 is an optical detector for signal reproduction corresponding to the Optical detector 5 in FIG. 1; PD2 is an optical detector for laser beam detection corresponding to the Optical detector 6 in FIG. 1; a Beam Splitter corresponds to the Beam splitter 4 in FIG. 1; ATT is an attenuator to adjust the return light ratio; Mirror imitates a reflective surface of the optical disc; Amp1 and Amp2 correspond to the amplifier circuit 7 in FIG. 1; LPF corresponds to the filter circuit 8 in FIG. 1; and a DC Bias Current source, a coil and a condenser correspond to the Drive circuit 3 in FIG. 1. Furthermore, in order to observe a laser beam, a spectrum analyzer was prepared and a Power Meter for measuring the intensity of reproduced signal detected by PD1 was prepared.

The frequency characteristics of the relative intensity noise (RIN) under operations by applying and not applying the electric feedback to the blue-violet semiconductor laser were measured using the measuring device shown in FIG. 3, respectively. The measurement conditions on that occasion were output light intensity=2.0 mW (DC drive current: 44 mA), laser temperature=25 degrees C., distance between the blue-violet semiconductor laser and Mirror=15 cm and total gain of Amp1 and Amp2=30 dB.

Figure 4:
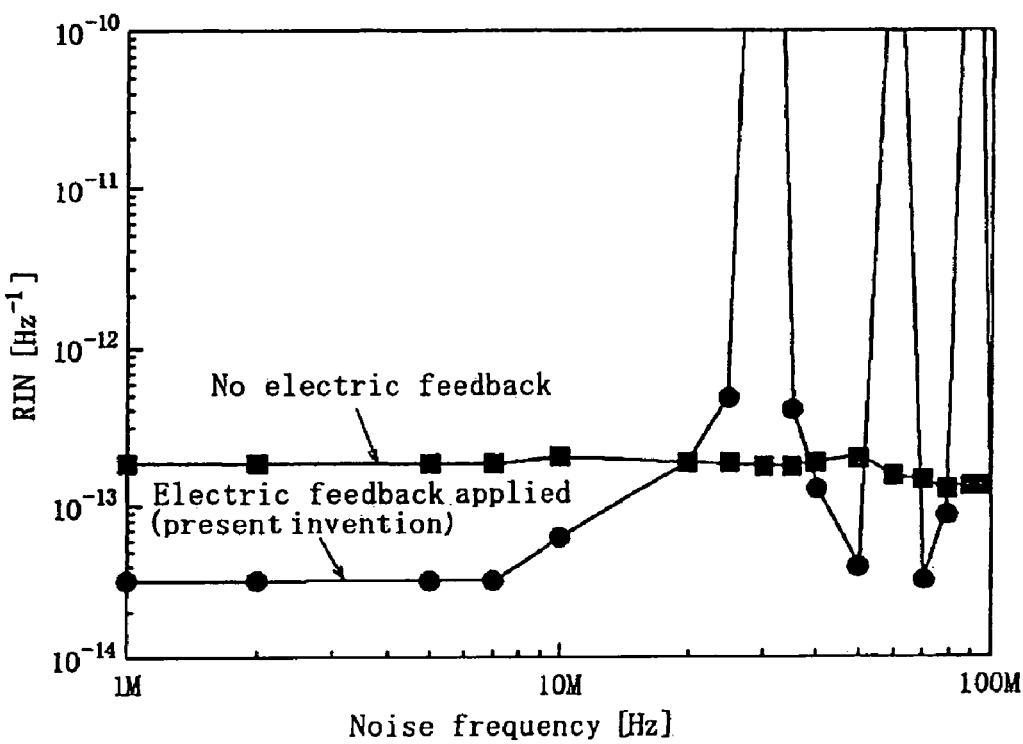
FIGS. 4(a) and (b) are characteristic diagrams for comparing and describing the frequency characteristics of relative intensity noise (RIN) with and without the return light when electric feedback is applied or is not applied to the blue-violet semiconductor laser using the measuring device shown in FIG. 3.
Figure 4:
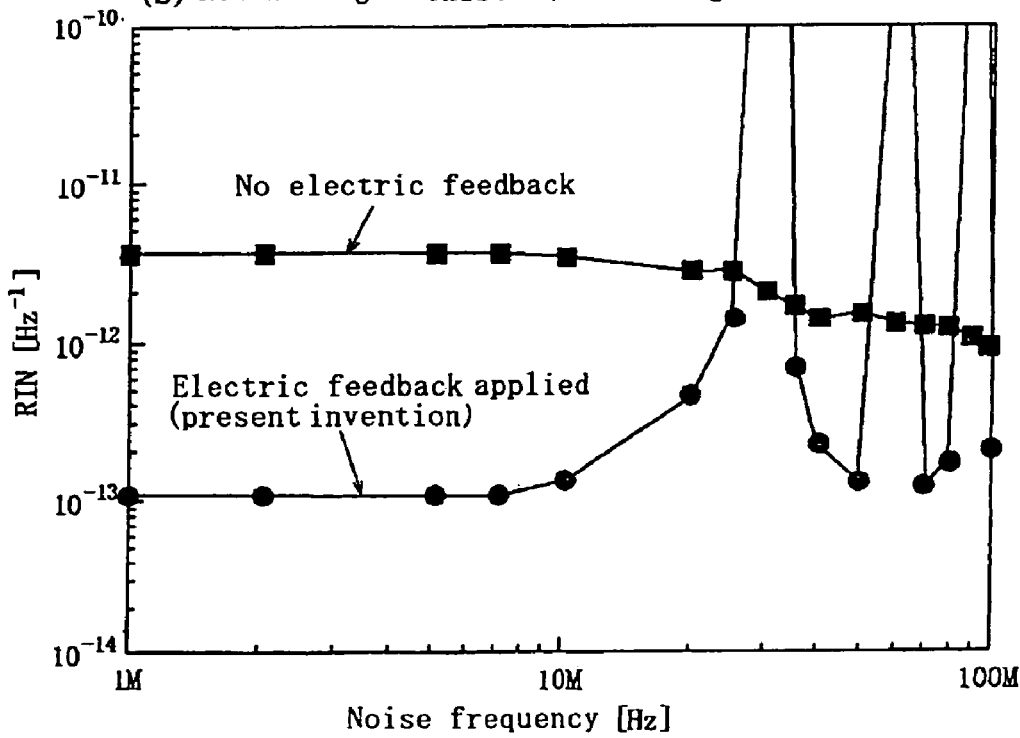

As a result, the frequency characteristic of RIN shown in FIG. 4(a) is obtained for the case when there is no return light, and the frequency characteristic of RIN shown in FIG. 4(b) is obtained for the case when the return light exist (return light ratio=0.0048).

Based upon the frequency characteristic of RIN shown in FIG. 4(a) and the frequency characteristic of RIN shown in FIG. 4(b), it could be confirmed that, "when applying the electric feedback in the present invention (electric feedback applied shown in FIG. 4(b)), the optical feedback noise is reduced to lower than the quantum noise level in the low frequency band up to approximately 10 MHz compared to the case of not applying any electric feedback (no electric feedback shown in FIG. 4(a))". Further, based upon the frequency characteristic of RIN shown in FIG. 4(a), it could be confirmed, "when the present invention where the electric feedback is applied, the internal noise is reduced to lower than the quantum noise level in the low frequency band up to approximately 10 MHz compared to the case of not applying any electric feedback."

[Measurement of Noise Reduction Effect (2)]

In order to confirm the reduction effect of the internal noise due to the negative feedback in "$0 \leq \omega \leq \omega_1$" to be utilized as a signal in the optical pickup of the semiconductor laser drive system of the present invention and the reduction effect of the optical feedback noise due to the positive feedback with the angular frequency at "$\omega \approx \omega_0$", which is higher than the frequency "$0 \leq \omega \leq \omega_1$". At the same time, in order to compare to the noise reduction effect when using the high-frequency superposition method (prior art), the measuring devices shown in FIG. 5 and FIG. 6 were prepared.

Figure 5:
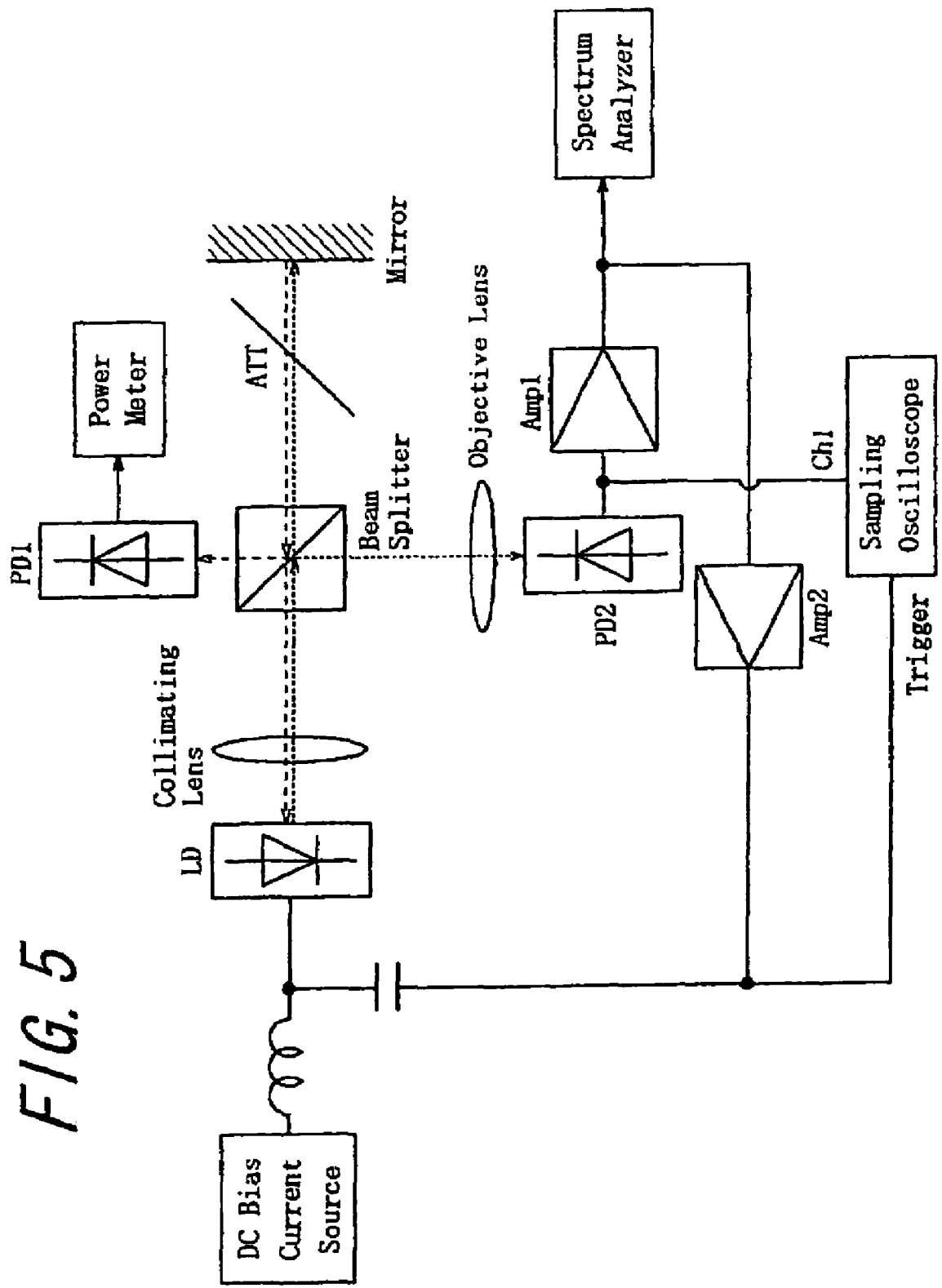
FIG. 5 is a diagram illustrating another configuration of the measuring device for confirming the noise reduction effect in the semiconductor laser drive system of the present invention.

The measuring device in FIG. 5 is to measure the noise reduction effect by using the electric positive & negative feedbacks. Here, compared to the measuring device shown in FIG. 3, LPF between the spectrum analyzer and AMP2 was eliminated and a sampling oscilloscope for observing the time waveform of the inputting electric signal to AMP1 was inserted between the connection point of AMP1 & PD2 and another connection point of AMP2 & the condenser. Other components are similarly configured to those of FIG. 3. Furthermore, the noise reduction effect by the measuring device in FIG. 5 has been improved from the measuring device shown in FIG. 3 by help of optimized design of AMP1 and AMP2.

Figure 6:
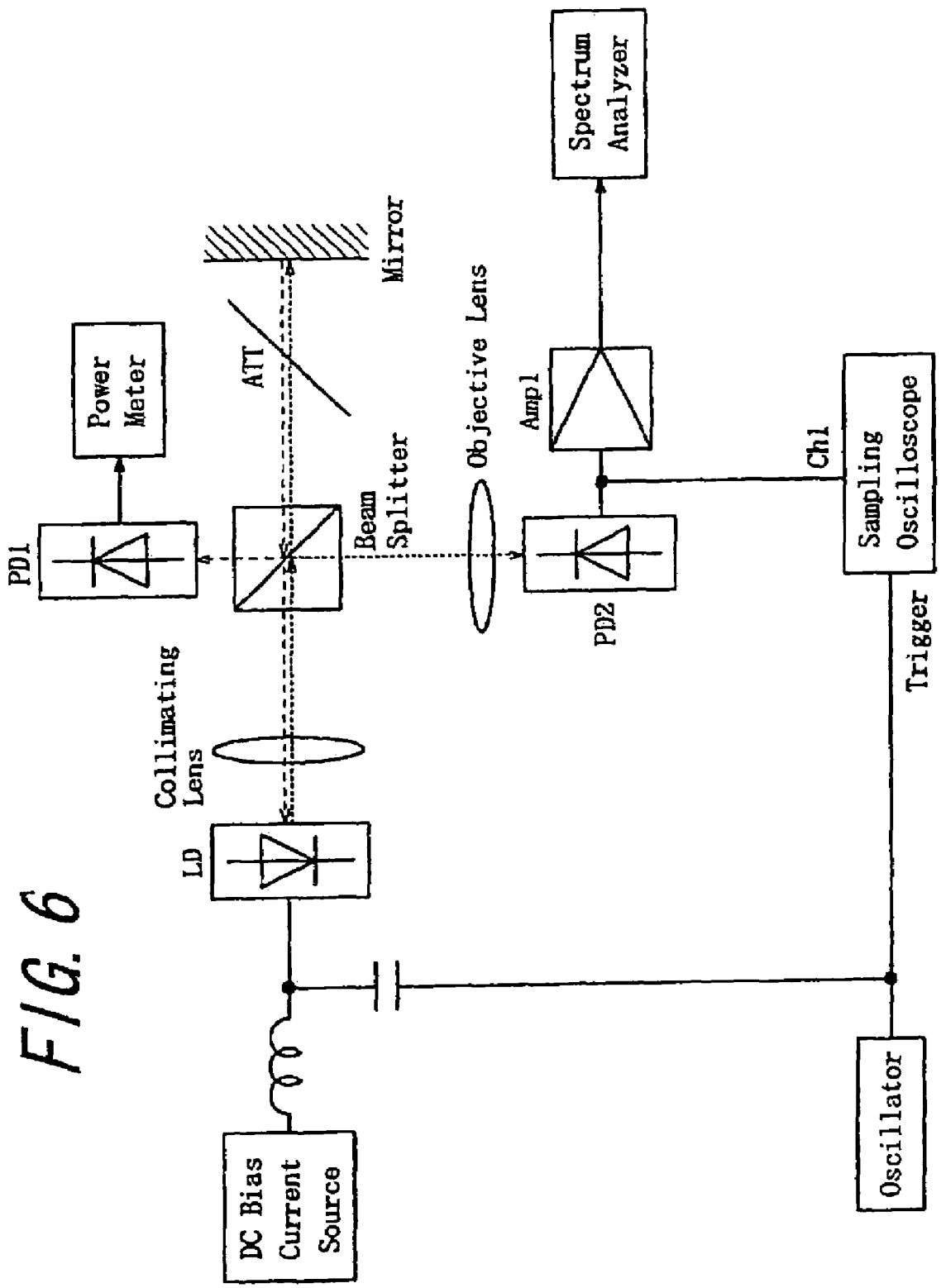
FIG. 6 is a diagram illustrating the configuration of the measuring device for high-frequency superposition method for comparing the noise reduction effect in the semiconductor laser drive system of the present invention to the noise reduction effect when using the high-frequency superposition method.

The measuring device in FIG. 6 measures the noise reduction effect by using the high-frequency superposition method (prior art). Compared to the measuring device in FIG. 5, AMP2 between the spectrum analyzer and the condenser was eliminated and an oscillator was added at a connection point of the sampling oscilloscope & the condenser. Other components are configured similarly to those in the measuring device shown in FIG. 5.

Figure 7:
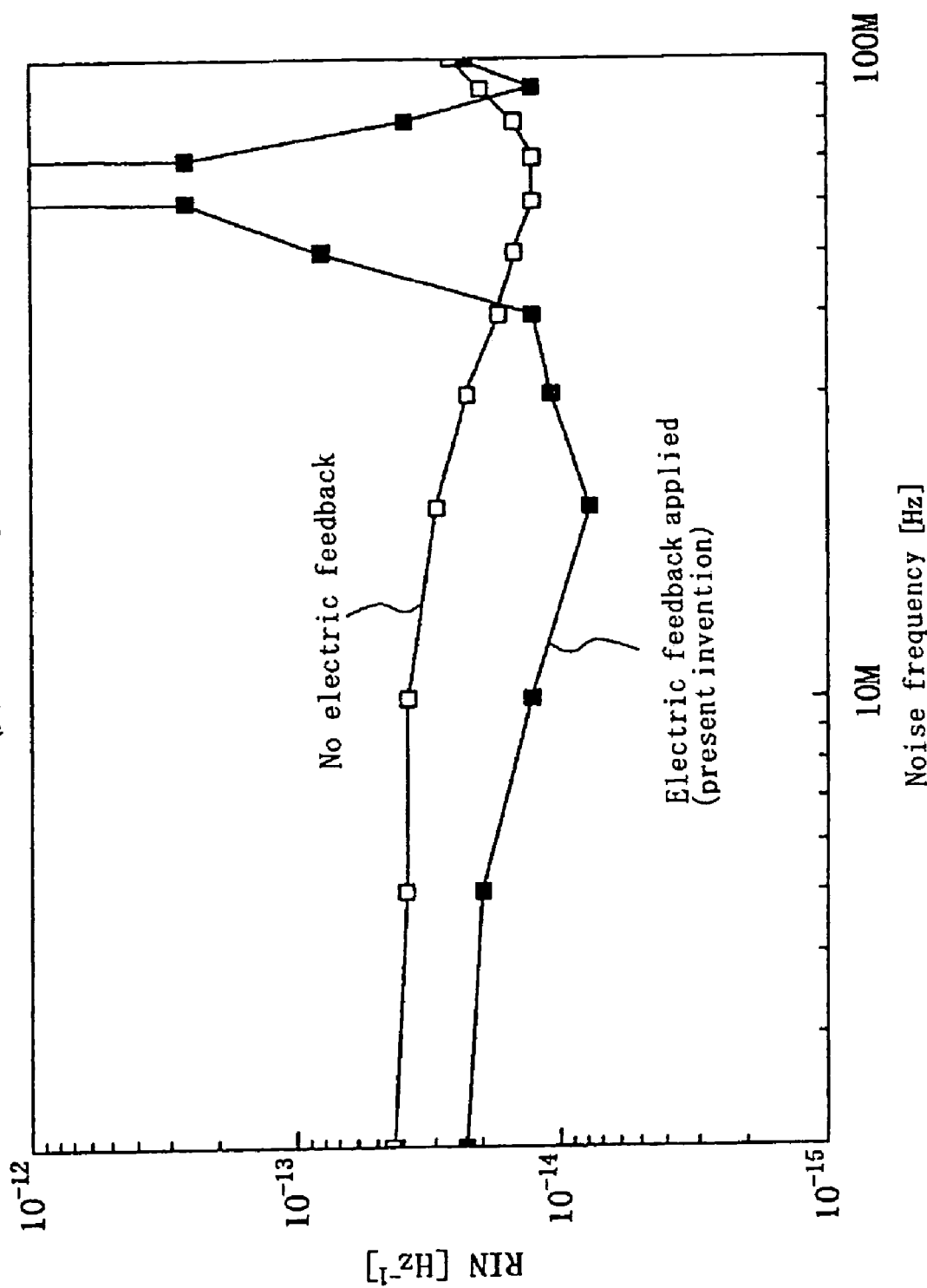
FIG. 7 is a characteristic diagram for comparing and describing the frequency characteristics of the relative intensity noise without a return light when electric feedback is applied to the blue-violet semiconductor laser using the measuring device in FIG. 5 and when no electric feedback is applied.

As the first, frequency characteristics of the relative intensity noise (RIN) under operation by applying and not applying the electric feedback to the blue-violet semiconductor laser were measured using the measuring device shown in FIG. 5, respectively. The measurement conditions on that occasion were output light intensity=3.0 mW (DC drive current: 45 mA), laser temperature=25 degrees C., distance between the blue-violet semiconductor laser and Mirror=15 cm and total gain of Amp1 and Amp2=35 dB. As a result, the frequency characteristic of RIN shown in FIG. 7 was obtained for the case when there is no return light, while the frequency characteristic of RIN shown in FIG. 8(a) was obtained for the case when the return light exit with return light ratio of $\Gamma=0.015$ and the frequency characteristic of RIN shown in FIG. 8(b) was obtained for the case when return light exist with return light ratio of $\Gamma=0.07$.

Figure 8:
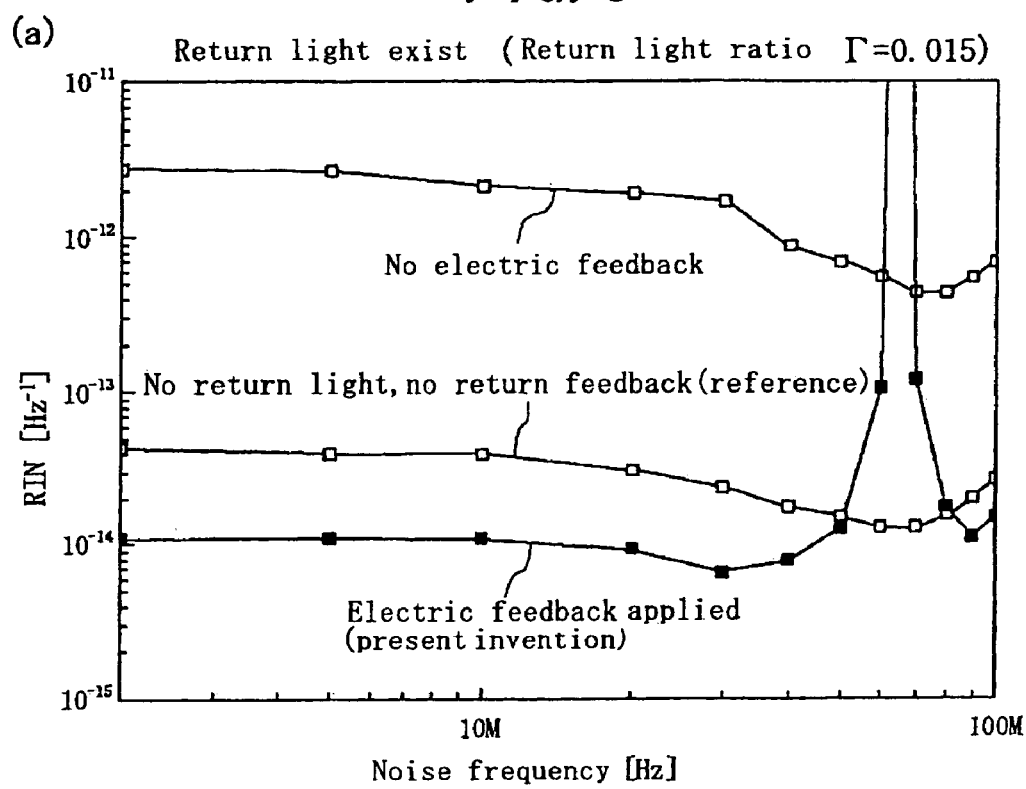
FIGS. 8(a) and (b) are characteristic diagrams for comparing and describing the frequency characteristics of the relative intensity noise with a return light when electric feedback is applied to the blue-violet semiconductor laser using the measuring device in FIG. 5 and when no electric feedback is applied, respectively.
Figure 8:
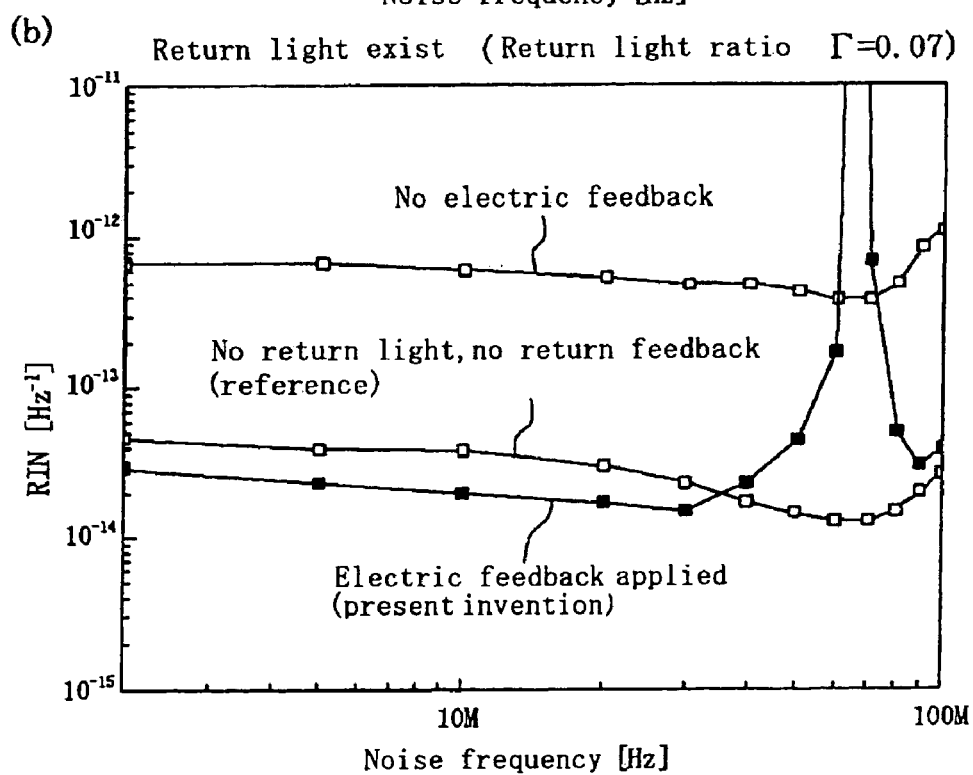

Based upon the frequency characteristics of RIN shown in FIGS. 8(a) and (b), it could be confirmed, "when the present invention where the electric feedback is applied (electric feedback applied shown in FIGS. 8(a) and (b)), the optical feedback noise was reduced to lower than the quantum noise level in the low frequency band up to approximately 30 MHz compared to the case of not applying any electric feedback". Further, based upon the frequency characteristic of RIN shown in FIG. 7, it could be confirmed, "when the present invention where the electric feedback is applied, the internal noise is reduced to lower than the quantum noise level in the low frequency band up to approximately 30 MHz compared to the case of not applying any electric feedback."

Figure 9:
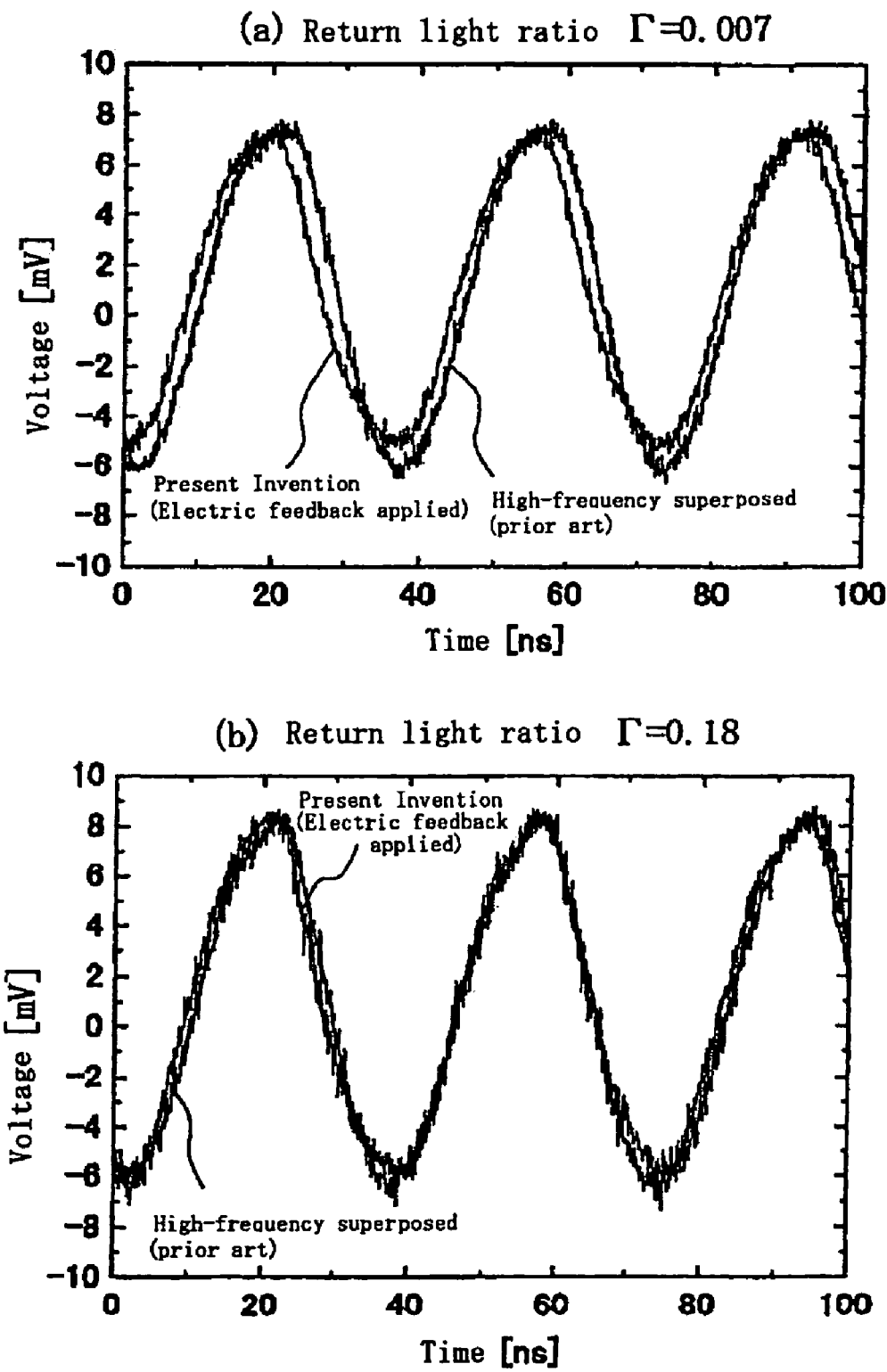
FIGS. 9(a) and (b) are characteristic diagrams illustrating a temporal waveform of a sampling oscilloscope in the semiconductor laser drive system of the present invention and in the semiconductor laser drive system using a high-frequency superimposition method, respectively.

As the next, the high-frequency superposition (prior art) at predetermined frequency was applied to the blue-violet semiconductor laser to compare to "the case of the present invention where the electric feedback is applied" and to "the case with neither high-frequency superposition nor electric feedback", by measuring relation between the return light ratio (feedback ratio) Γ and the relative intensity noises using the measuring device shown in FIG. 6. The measurement conditions on that occasion were laser temperature=25 degrees C., distance between the blue-violet semiconductor laser and Mirror=15 cm, lasing threshold current Ith=42.5 mA and the DC drive current I=45 mA. In this measurement, the frequency and the intensity of the Oscillator for the high-frequency superposition were adjusted to match the time waveform shown on the Sampling Oscilloscope detected by PD2 with the time waveform (electric feedback applied) as shown in FIG. 9.

Figure 10:
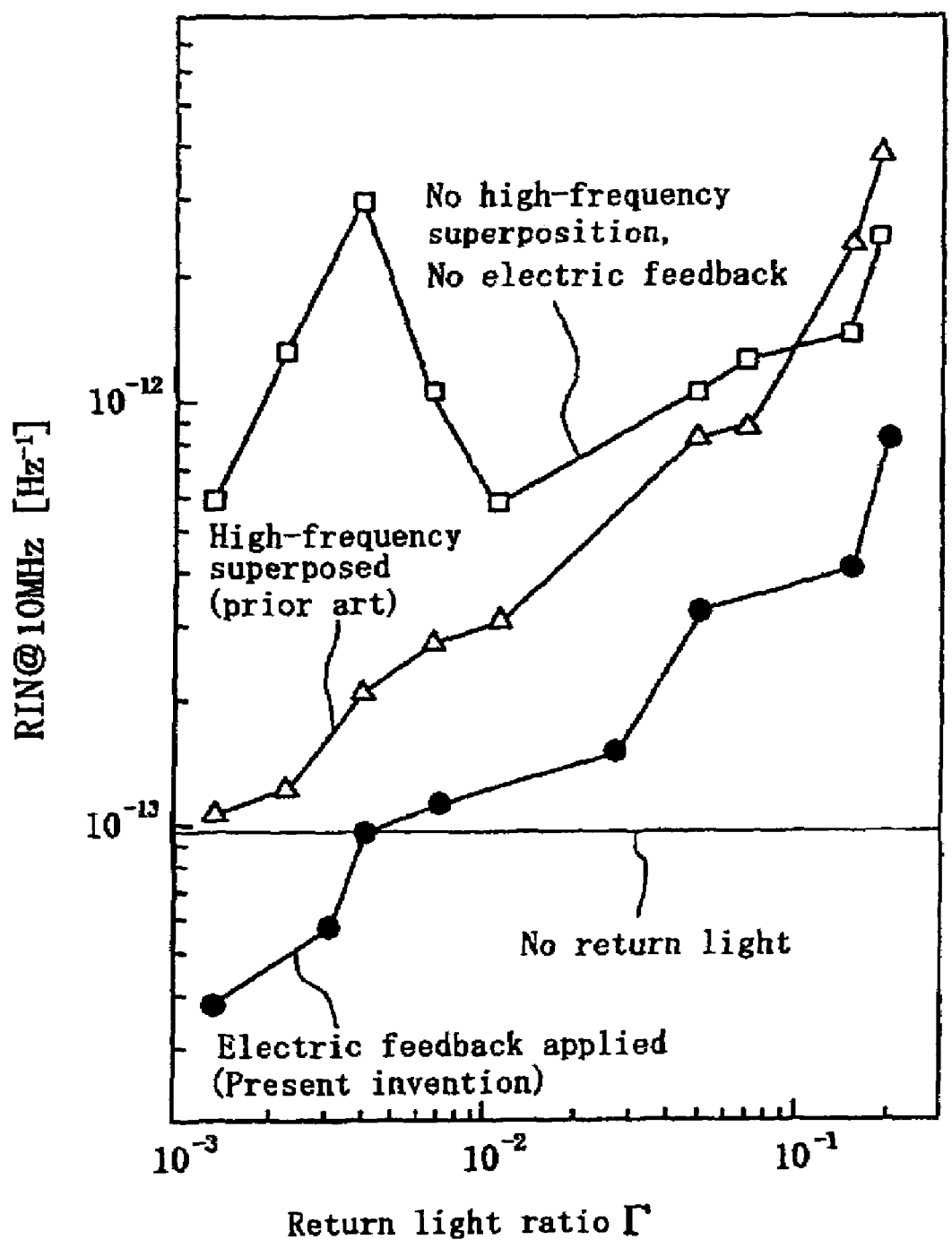
FIG. 10 is a characteristic diagram showing comparison of a relationship between RIN and a return light ratio at 10 MHz of noise frequency in the semiconductor laser drive system of the present invention and in the semiconductor laser drive system using the high-frequency superimposition method.

FIG. 10 shows the relationship between RIN and the return light ratio Γ at 10 MHz of noise frequency measured with this method.

Based upon the relationship between RIN and the return light ratio Γ at 10 MHz of noise frequency shown in FIG. 10, it could be confirmed, "when the present invention where the electric feedback is applied (with electric feedback applied in FIG. 10), the optical feedback noise is more reduced compared to the case with the high-frequency superposed (prior art)".

INDUSTRIAL AVAILABILITY

The semiconductor laser drive system and the semiconductor laser driving method of the present invention can be preferably used for an optical device having an optical system that is configured such that a return light from an irradiated object of a laser beam emitted from a semiconductor laser, such as an optical pickup, an optical fiber communication light source or various optical measuring device light sources, enters into the semiconductor laser.

The invention claimed is:

1. A semiconductor laser drive system in an optical device having an optical system that is configured such that a return light from an irradiated object of a laser beam emitted from a semiconductor laser enters into the semiconductor laser, the system comprising:
   a drive circuit for driving the semiconductor laser,
   an optical detector for detecting light intensity of the laser beam emitted from the semiconductor laser, and converting the light intensity into an electric signal, and
   a feedback circuit that is arranged between the drive circuit and the light detector for selectively applying negative feedback or positive feedback to the drive circuit according to whether or not the frequency of the electric signal is within a frequency band to be utilized as a signal.

2. The semiconductor laser drive system according to claim 1, wherein the feedback circuit is composed of an amplifier circuit and a filter circuit, and an amplification factor of the amplifier circuit and a phase characteristic of the filter circuit are set to apply the negative feedback to the drive circuit of the semiconductor laser if the frequency of the electric signal is within the frequency band to be utilized as a signal, and the amplification factor and the phase characteristic are set to apply the positive feedback to the drive circuit of the semiconductor laser if the frequency of the electric signal is outside the frequency band to be utilized as a signal.

3. The semiconductor laser drive system according to claim 1, wherein the semiconductor laser is a blue-violet semiconductor laser.

4. A semiconductor laser driving method in an optical device having an optical system configured such that a return light from an irradiated object of a laser beam emitted from a semiconductor laser enters into the semiconductor laser, the method comprising the steps of:
   detecting light intensity of the laser beam emitted from the semiconductor laser in order to convert into an electric signal; and
   selectively applying negative feedback or positive feedback to the drive circuit of the semiconductor laser according to whether or not the frequency of the electric signal is within the frequency band to be utilized as a signal.

5. The semiconductor laser driving method according to claim 4, wherein the negative feedback is applied to the drive circuit of the semiconductor laser if the frequency of the electric signal is within the frequency band to be utilized as a signal, and the positive feedback is applied to the drive circuit of the semiconductor laser if the frequency of the electric signal is outside the frequency band to be utilized as a signal.

6. The semiconductor laser driving method according to claim 4, wherein the semiconductor laser is a blue-violet semiconductor laser.

7. An optical disc device having an optical system that is configured such that a return light from an irradiated object of a laser beam emitted from a semiconductor laser enters into the semiconductor laser, comprising:
   a drive circuit for driving the semiconductor laser,
   an optical detector for detecting light intensity of the laser beam emitted from the semiconductor laser, and converting the light intensity into an electric signal, and
   a feedback circuit that is arranged between the drive circuit and the light detector for selectively applying negative feedback or positive feedback to the drive circuit according to whether or not the frequency of the electric signal is within a frequency band to be utilized as a signal.

8. A feedback circuit comprising an amplifier circuit and a filter circuit, which is used for the optical disc device according to claim 7, wherein an amplification factor of the amplifier circuit and a phase characteristic of the filter circuit are set to apply the negative feedback to the drive circuit of the semiconductor laser if the frequency of the electric signal is within the frequency band to be utilized as a signal, and the amplification factor and the phase characteristic are set to apply the positive feedback to the drive circuit of the semiconductor laser if the frequency of the electric signal is outside the frequency band to be utilized as a signal.

9. The semiconductor laser drive system according to claim 2, wherein the semiconductor laser is a blue-violet semiconductor laser.

10. The semiconductor laser driving method according to claim 5, wherein the semiconductor laser is a blue-violet semiconductor laser.

* * * * *